Aug. 27, 1968 F. RACHAL ET AL 3,399,360

LOW FREQUENCY DRIFT FIELD OSCILLATOR

Filed Sept. 26, 1967

INVENTORS
FRANCIS RACHAL
JAMES R. CRICCHI
BY Harry A. Herbert Jr
ATTORNEY
Richard J. Killoren
AGENT United States Patent Office 3,399,360

Patented Aug. 27, 1968

3,399,360

LOW FREQUENCY DRIFT FIELD OSCILLATOR

Francis Rachal and James R. Cricchi, Baltimore, Md., assignors, by mesne assignments, to the United States of America as represented by the Secretary of the Air Force Filed Sept. 26, 1967, Ser. No. 670,819
3 Claims. (Cl. 331—108)

ABSTRACT OF THE DISCLOSURE

An inverting transistor amplifier has an emitter follower connected in the collector output circuit thereof. A feedback loop is provided between the output of the emitter follower and the input of the inverting amplifier. A plurality of cascaded delay lines are connected in the feedback loop. Interstage gain is provided between the delay lines which have their voltage control circuits connected in parallel across the control voltage source.

*Background of the invention*

The use of a semiconductor delay line in the feedback loop of an amplifier to achieve oscillator action is shown in the article, "Molecularized FM Telemetry Encoder," pages 169–177, IEEE Transactions on Communications Technology, April 1966, vol. 14, No. 2. In order to operate such a device at low frequencies, for example in the 400 c./s. range, the delay lines become very long and the drift field voltages and signal attenuation become very high. By cascading delay lines, frequencies as low as 1 kc. have been attained but delay lines suitable for 400 c.p.s. oscillators have not been successful.

*Summary of the invention*

According to this invention, low frequency drift field oscillators for frequencies below 1 kc. are provided by cascading delay lines with interstage gain and by interconnecting odd multiples of oscillator stages.

*Description of the preferred embodiment*

Figure 1:
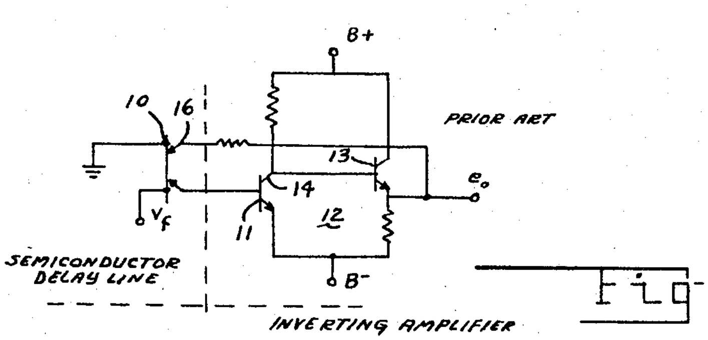
FIG. 1 is a schematic diagram of a prior art drift field oscillator.

Reference is now made to the prior art structure in FIG. 1 of the drawing. In this device, a voltage tunable semiconductor delay line 10 is connected in the feedback loop of an inverting amplifier 12. The time interval required for signals to be propagated through the delay line 10 is determined by the value of the negative control voltage applied at $V_f$. The propagation time of the signals through the delay line for the applied voltage $V_f$ will provide regenerative effects for certain frequencies to thus provide a frequency selective oscillator circuit. The emitter follower output stage 13 is used to provide isolation and impedance matching between the collector electrode 14 of transistor 11 and the injector emitter electrode 16 of the delay line 10. With the D.C. coupled oscillator of FIG. 1 there is a negative D.C. feedback loop and a positive feedback loop for A.C. signals because of the phase shift in the delay line.

Figure 2:
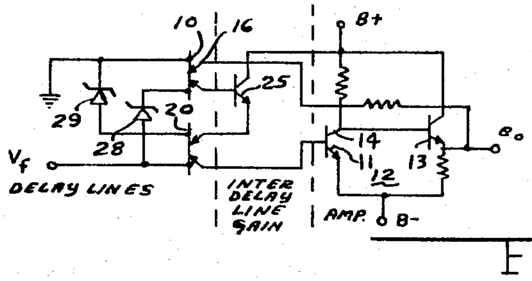
FIG. 2 is a schematic diagram of a low frequency drift field oscillator according to one embodiment of the invention.

To overcome the problems encountered with the use of long delay lines for low frequencies according to this invention, the device of FIG. 2 has two drift field delay lines 10 and 20 connected in the feedback loop of the inverting amplifier 12. A gain stage between delay line 10 and delay line 20 is provided by means of an emitter follower transistor stage 25 to overcome the attenuation in the delay lines. Zener diodes 28 and 29 provide the proper control voltages for the delay lines 10 and 20, respectively. With this arrangement, lower control voltages, than required by prior art devices, can be used. The remainder of the circuit is the same as in FIG. 1.

Figure 3:
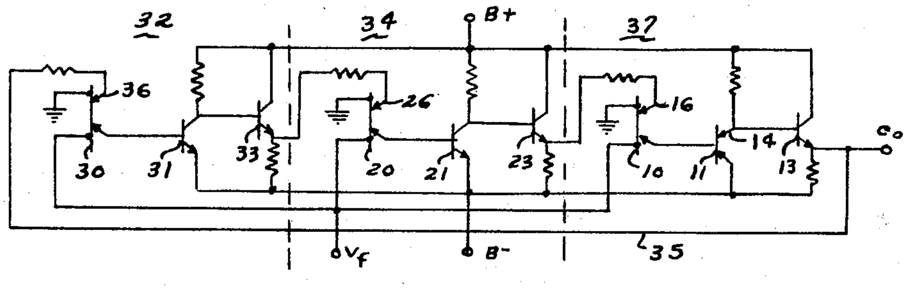
FIG. 3 is a schematic diagram of a low frequency drift field oscillator according to another embodiment of the invention.

Another circuit for obtaining low frequency oscillators is shown in FIG. 3. In this device, an odd number of stages 32, 34 and 37, such as shown in FIG. 1, are D.C. coupled. In this case, the feedback path is omitted in the individual stages with a feedback path being provided between the output of stage 37 and the input of stage 32, with line 35 being connected to the injector emitter electrode 36 of delay line 30 in stage 32. The output of delay line 30 is fed to the base input of transistor 31, the output of delay line 20 is fed to the base input of transistor 21, and the output of delay line 10 is fed to the base input of transistor 11. Also the output of emitter follower 33 is applied to injector emitter electrode 26 of delay line 20 and the output of emitter follower 23 is applied to injector emitter electrode 16. In this device, the delay lines 10, 20 and 30 are connected in parallel between the control voltage supply $V_f$ and ground. Because of the polarity inversion in the transistors 11, 21 and 31, the same control voltage can be supplied to the three delay lines and Zener diodes are not needed. An even number of inverting amplifier stages cannot be used with this device since it would provide D.C. positive feedback and the circuit will not assume the proper bias conditions. Each of these circuits, in tests, have been found to provide the desired low frequency operation.

There is thus provided a drift field oscillator for operation at the low frequency range below 1 kc.

While certain specific embodiments have been described, it is obvious that numerous changes may be made without departing from the general principles and scope of the invention.

We claim:

1. A low frequency drift field oscillator circuit comprising: a transistor inverting amplifier circuit; an emitter follower connected in the collector output circuit of said transistor inverting amplifier circuit; means, including a plurality of voltage controlled drift field delay lines, connected between the output of said emitter follower and the base input circuit of said transistor inverting amplifier circuit, for providing negative D.C. feedback and positive feedback for A.C. signals; means, connected between the drift field delay lines, for providing signal gain between said drift field delay line stages; and means for supplying a predetermined control voltage to said delay lines.

2. The device as recited in claim 1 wherein said means for providing gain between the drift delay line stages is an emitter follower transistor amplifier circuit.

3. The device as recited in claim 1 wherein there is an odd number of drift field delay lines and said means for providing gain between the drift field delay line stages is an inverting amplifier circuit with an emitter follower connected in its collector output circuit.

No references cited.

ROY LAKE, *Primary Examiner.*

S. H. GRIMM, *Assistant Examiner.*